United States Patent
Janneck et al.

(10) Patent No.: US 7,496,869 B1
(45) Date of Patent: Feb. 24, 2009

(54) METHOD AND APPARATUS FOR IMPLEMENTING A PROGRAM LANGUAGE DESCRIPTION OF A CIRCUIT DESIGN FOR AN INTEGRATED CIRCUIT

(75) Inventors: Jorn W. Janneck, San Jose, CA (US); David B. Parlour, Pittsburgh, PA (US)

(73) Assignee: Xilinx, Inc., San Jose, CA (US)

( * ) Notice: Subject to any disclaimer, the term of this patent is extended or adjusted under 35 U.S.C. 154(b) by 274 days.

(21) Appl. No.: 11/243,679

(22) Filed: Oct. 4, 2005

(51) Int. Cl.
*G06F 17/50* (2006.01)

(52) U.S. Cl. .................................. 716/3; 716/1; 716/18

(58) Field of Classification Search .................... 716/3, 716/18, 1
See application file for complete search history.

(56) References Cited

U.S. PATENT DOCUMENTS

| | | | |
|---|---|---|---|
| 4,758,953 | A | 7/1988 | Morita et al. |
| 5,095,441 | A | 3/1992 | Hopper et al. |
| 5,247,651 | A | 9/1993 | Clarisse |
| 5,249,133 | A | 9/1993 | Batra |
| 5,452,239 | A | 9/1995 | Dai et al. |
| 5,553,272 | A | 9/1996 | Ranganathan et al. |
| 5,870,588 | A | 2/1999 | Rompaey et al. |
| 5,896,301 | A | 4/1999 | Barrientos |
| 5,898,595 | A | 4/1999 | Bair et al. |
| 5,910,899 | A | 6/1999 | Barrientos |
| 6,011,911 | A | 1/2000 | Ho et al. |
| 6,023,567 | A | 2/2000 | Osler et al. |
| 6,078,736 | A | 6/2000 | Guccione |
| 6,131,080 | A | 10/2000 | Raimi et al. |
| 6,135,647 | A * | 10/2000 | Balakrishnan et al. ........ 716/18 |
| 6,154,719 | A | 11/2000 | Saitoh et al. |
| 6,230,299 | B1 | 5/2001 | McSherry et al. |
| 6,272,671 | B1 | 8/2001 | Fakhry |
| 6,298,472 | B1 | 10/2001 | Phillips et al. |
| 6,530,071 | B1 | 3/2003 | Guccione et al. |
| 6,530,072 | B1 | 3/2003 | Hagerman et al. |
| 6,546,532 | B1 | 4/2003 | Kerzman et al. |
| 6,557,156 | B1 | 4/2003 | Guccione |
| 6,622,291 | B1 | 9/2003 | Ginetti |

(Continued)

OTHER PUBLICATIONS

Hsu, Chia-Jui et al., "DIF: An Interchange Format For Dataflow-based Design Tools", International Workshop on Systems, Architectures, Modeling and Simulation, Jul. 2004, pp. 1-10, available from Department of Electrical and Computer Engineering and Institute for Advanced Computer Studies, University of Maryland, College Park, 20742.

(Continued)

*Primary Examiner*—Jack Chiang
*Assistant Examiner*—Nghia M. Doan
(74) *Attorney, Agent, or Firm*—Robert M. Brush

(57) ABSTRACT

Method and apparatus for implementing a program language description of a circuit design for an integrated circuit is described. In one example, a program is specified using a concurrent programming language. The program includes programming constructs that define a plurality of processes and a plurality of communication channels. A hierarchy of elements that classify the programming constructs of the program are generated to produce a transformed representation. A hardware description language (HDL) representation of the circuit design is generated from the transformed representation by translating the hierarchy of elements to a hierarchy of HDL constructs that implements the plurality of processes and the plurality of communication channels in hardware.

16 Claims, 7 Drawing Sheets

U.S. PATENT DOCUMENTS

| | | |
|---|---|---|
| 6,678,646 B1 | 1/2004 | McConnell et al. |
| 6,691,301 B2 | 2/2004 | Bowen |
| 6,725,441 B1 | 4/2004 | Keller et al. |
| 6,756,922 B2 | 6/2004 | Ossia |
| 6,829,753 B2 | 12/2004 | Lee et al. |
| 6,865,726 B1 | 3/2005 | Igusa et al. |
| 6,868,017 B2 | 3/2005 | Ikeda |
| 6,868,532 B2 | 3/2005 | Nadeau-Dostie et al. |
| 6,922,665 B1 | 7/2005 | Guccione et al. |
| 6,988,238 B1 | 1/2006 | Kovacevic et al. |
| 6,993,733 B2 | 1/2006 | Murphy |
| 7,003,751 B1 | 2/2006 | Stroomer et al. |
| 7,006,960 B2 | 2/2006 | Schaumont et al. |
| 7,024,654 B2 | 4/2006 | Bersch et al. |
| 7,062,418 B2 | 6/2006 | Lee et al. |
| 7,073,152 B2 | 7/2006 | Keller et al. |
| 7,139,955 B2 | 11/2006 | Rohrbaugh et al. |
| 7,143,367 B2 | 11/2006 | Eng |
| 7,146,300 B2 | 12/2006 | Zammit et al. |
| 7,146,583 B1 | 12/2006 | Sun et al. |
| 7,194,705 B1 | 3/2007 | Deepak et al. |
| 7,194,714 B2 | 3/2007 | Kartschoke et al. |
| 7,203,632 B2 | 4/2007 | Milne et al. |
| 7,216,321 B2 | 5/2007 | Murphy et al. |
| 7,315,991 B1 * | 1/2008 | Bennett .................. 716/1 |
| 2001/0007139 A1 | 7/2001 | Murray |
| 2002/0049958 A1 | 4/2002 | Shimazawa |
| 2002/0059054 A1 | 5/2002 | Bade et al. |
| 2003/0084416 A1 | 5/2003 | Dai et al. |
| 2003/0216901 A1 | 11/2003 | Schaumont et al. |
| 2004/0015613 A1 | 1/2004 | Ikeda |
| 2004/0141354 A1 | 7/2004 | Carnahan |
| 2005/0063481 A1 | 3/2005 | Fechtel et al. |
| 2005/0188339 A1 | 8/2005 | Anderson |
| 2005/0210383 A1 | 9/2005 | Cucerzan et al. |
| 2005/0268258 A1 | 12/2005 | Decker |
| 2005/0268269 A1 | 12/2005 | Colley |
| 2006/0059134 A1 | 3/2006 | Palmon et al. |
| 2006/0090146 A1 | 4/2006 | LeBritton et al. |
| 2006/0136193 A1 | 6/2006 | Lux-Pogodalia et al. |
| 2006/0200788 A1 * | 9/2006 | Nation et al. ............. 716/18 |
| 2008/0077377 A1 | 3/2008 | Roesner et al. |

OTHER PUBLICATIONS

Lee, Edward A. et al., "Dataflow Process Networks", May 1995, pp. 773-799, IEEE, vol. 83, No. 5, available from IEEE, 3 Park Avenue, 17th Floor, New York, NY 10016-5997.

Eker, Johan et al., "Cal Language Report", Specification of the CAL actor language, ERL Technical Memo UCB/ERL M03/48, Dec. 1, 2003, pp. 1-128, version 1.0, Ed. 1, available from University of California at Berkeley, Berkeley, CA 94720.

Bhattacharyya Shuvra Shikhar, "Compiling Dataflow Programs For Digital Signal Processing", Jul. 1994, pp. 1-250, available from Department of Electrical Engineering and Computer Sciences, University of California at Berkeley, Berkeley, CA 94720.

XAPP290, Xilinx, Inc., 2100 Logic Drive, San Jose, CA 95124.

Tanaka et al., "High Speed String Edit Methods Using Hierarchical Files and Hashing Technique," Nov. 14-17, 1988 Pattern Recognition: 9th International Conference, vol. 1, copyright 1998 IEEE, pp. 334-336.

Ravasi, Massimo et al., "High-Level Algorithmic Complexity Evaluation for System Design," Journal of Systems Architecture, Feb. 2003, copyright 2003 Elsevier Science, B.V., available at www.computerscienceweb.com, pp. 403-427.

Navarro, Gonzalo, "Pattern Matching," Department of Computer Science, University of Chile, Mar. 7, 2005, pp. 1-24, available from the internet at http://www.ciw.cl/publicaciones/jstat04.pdf.

Gillelnad, Michael, "Levebshtein Distance in Three Flavors," available from http://www.merriampark.com/ld.htm, pp. 1-2.

Bhattacharyya, et al., "Ptolemy II, Heterogeneous Concurrent Modeling and Design in Java", Department of Electrical Engineering and Computer Sciences, University of California at Berkeley, Jul. 29, 2004, 282 pages, http://ptolemy.eecs.berkeley.edu.

U.S. Appl. No. 11/373,745, filed Mar. 10, 2006, Janneck et al., Xilinx, Inc., 2100 Logic Drive, San Jose, CA 95124.

U.S. Appl. No. 11/373,744, filed Mar. 10, 2006, Janneck et al., Xilinx, Inc., 2100 Logic Drive, San Jose, CA 95124.

U.S. Appl. No. 11/373,709, filed Mar. 10, 2006, Schumacher et al., Xilinx, Inc., 2100 Logic Drive, San Jose, CA 95124.

U.S. Appl. No. 11/243,732, filed Oct. 4, 2005, Vogenthaler, Xilinx, Inc., 2100 Logic Drive, San Jose, CA 95124.

U.S. Appl. No. 11/083,667, filed Mar. 18, 2005, Milne et al., Xilinx, Inc., 2100 Logic Drive, San Jose, CA 95124.

* cited by examiner

```
302
  <xhdl-actor name="...">

304   <xhdl-input-port name="..." type="...">
316     <xhdl-action-ref tag="..." index="..."/>
        </xhdl-input-port>

306   <xhdl-output-port name="..." type="...">
318     <xhdl-action-ref tag="..." index="..."/>
        </xhdl-output-port>

308   <xhdl-generic name="..." type="..."/>

310   <xhdl-variable name="..." type="...">
320     <xhdl-initialize>
322       <xhdl-expr string="..."/>
        </xhdl-initialize>
324     <xhdl-action-ref index="..." tag="..."/>
        </xhdl-variable>

312   <xhdl-state-machine initial-state="...">
325     <xhdl-state name="..."/>
        </xhdl-state-machine>

314   <xhdl-action tag="..." index="...">
326     <xhdl-transition>                        337
          <xhdl-from-state name="..."/>
          <xhdl-to-state name="..."/>_338
328     </xhdl-transition>
        <xhdl-guard>                    340
          <xhdl-expr string="..."/>
        </xhdl-guard>
330     <xhdl-port-alias name="..." port="..."/>
332     <xhdl-compute-output port="...">
          <xhdl-expr string="..."/>_342
        </xhdl-compute-output>
334     <xhdl-statement type="..." ...>
          ...  ←————— 344
336     </xhdl-statement>
        <xhdl-sense name="..."/>
      </xhdl-action>
    </xhdl-actor>
```

METHOD AND APPARATUS FOR IMPLEMENTING A PROGRAM LANGUAGE DESCRIPTION OF A CIRCUIT DESIGN FOR AN INTEGRATED CIRCUIT

FIELD OF THE INVENTION

One or more aspects of the present invention relate generally to integrated circuit design tools and, more particularly, to a method and apparatus for implementing a program language description of a circuit design for an integrated circuit.

BACKGROUND OF THE INVENTION

Modern integrated circuits are designed using programmed computers. Such computers are conventionally programmed with Electronic Design Automation (EDA) and Electronic Computer-Aided Design (ECAD) tools (generally referred to as EDA tools). EDA tools process an abstract representation of a circuit design into a physical representation of the circuit design that can be implemented using integrated circuitry. For example, a circuit design may be specified by a designer using a hardware description language (HDL), such as the very high speed integrated circuit hardware description language (VHDL) or VERILOG.

Presently, EDA systems cannot map ordinary sequential programs into efficient concurrent circuit implementations. Sequential programming languages, such as C, obscure the concurrency available in an algorithm and encourage the specification of systems that assume all data resides in one globally accessible memory. As such, this form of specification is not suited for concurrent circuit implementations. Accordingly, there exists a need in the art for a method and apparatus for providing an efficient concurrent circuit implementation of a program language description of a circuit design for an integrated circuit.

SUMMARY OF THE INVENTION

Method and apparatus for implementing a program language description of a circuit design for an integrated circuit is described. In one embodiment, a program is specified using a concurrent programming language. The program includes programming constructs that define a plurality of processes and a plurality of communication channels. A hierarchy of elements that classify the programming constructs of the program is generated to produce a transformed representation. A hardware description language (HDL) representation of the circuit design is generated from the transformed representation by translating the hierarchy of elements to a hierarchy of HDL constructs that implements the plurality of processes and the plurality of communication channels in hardware.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 3 illustrates an exemplary embodiment of a hierarchy of elements in a transformed representation of the program language description in accordance with one or more aspects of the invention;

DETAILED DESCRIPTION OF THE DRAWINGS

Method and apparatus for implementing a program language description of a circuit design for an integrated circuit is described. One or more aspects of the invention relate to a programming model and supporting implementation methodology for capturing descriptions of concurrent systems in an abstract, implementation-independent form that can be translated automatically to a target platform in an efficient manner. The target platform may be any programmable system that provides concurrent execution mechanisms, such as a programmable logic device (PLD), a processor array, or a heterogeneous platform with a mixture of elements, including programmable logic, special-purpose logic blocks, digital signal processors (DSPs), microprocessors, and the like. For purposes of clarity by example, one or more aspects of the invention relate to designing a concurrent system for a field programmable gate array (FPGA) target platform.

Figure 1:
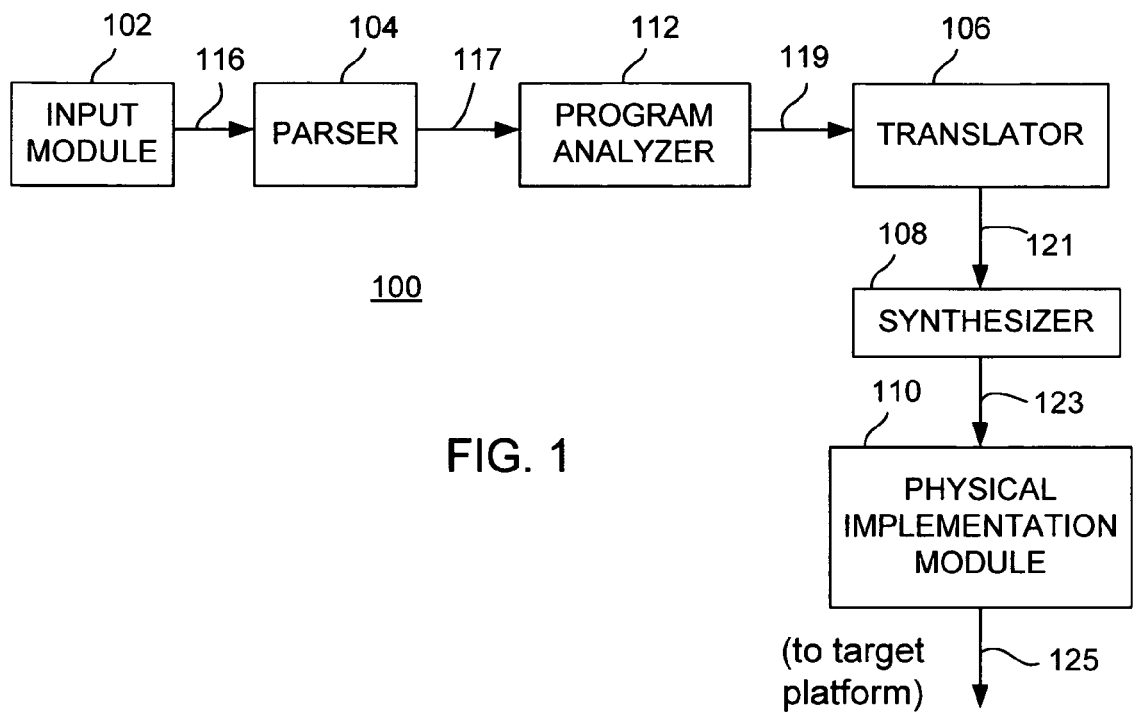
FIG. 1 is a block diagram depicting an exemplary embodiment of an electronic design system constructed in accordance with one or more aspects of the invention.

FIG. 1 is a block diagram depicting an exemplary embodiment of an electronic design system 100 constructed in accordance with one or more aspects of the invention. The system 100 includes an input module 102, a parser 104, a program analyzer 112, a translator 106, a synthesizer 108, and a physical implementation module 110. The system 100 is configured to transform a program that provides an implementation-independent model of a concurrent system into implementation data for a target platform with heterogeneous concurrent processing elements. For example, the system 100 may generate configuration data to be loaded in a target FPGA for implementing a concurrent system.

In particular, the input module 102 is used to specify a program 116 via a concurrent programming language. The input module 102 may be a graphical user interface (GUI) or other type of interface known in the art with which a designer may interact to specify the program 116. A concurrent programming language is a language that reflects a concurrent programming model, rather than a conventional sequential programming model. The program 116 includes programming constructs that define a network of processes interconnected by communication channels, providing an implementation-independent software model of a concurrent system. As discussed below, the channels are more than just signal conductors, and may be able to receive input, store input, and make the input available at a later time (with ordering preserved) at the output side. Each process is described by the inputs and outputs it has, the actions it can perform, the rules for triggering the actions (firings), and the persistent state between firings. Notably, the process description does not imply an implementation technology (e.g., processor software, application specific integrated circuit (ASIC) hardware, FPGA hardware). As discussed below, the program 116 is analyzed and transformed into other representations that are computationally equivalent, but have different physical implementation properties.

In one embodiment, the program 116 is specified using an actor language known as the CAL programming language. For purposes of clarity by example, an embodiment of the invention is described below with specific reference to the CAL programming language. A description is given in the "CAL language Report", by Eber and Janneck, ERL technical Memo UCB/ERL M03/48, University of California at Berkeley, Dec. 1, 2003, which is herein incorporated by reference. Those skilled in the art will appreciate that the invention may be used with other languages that reflect concurrent programming models, such as SystemC. The program 116 includes units referred to as actors, which model the processes of a concurrent system. Actors communicate through ports and are opaque (i.e., their internal state is not visible outside the actor). The ports are unidirectional (input or output) and they communicate tokens, which are discrete units of data. Actors consume or produce discrete tokens as a result of action firings. The connections between actors, which model the communication channels of the concurrent system, represent a higher level of abstraction than simple wires. Channels can have memory, and it is possible for an actor to check the availability and value of tokens at its input ports.

Figure 2:
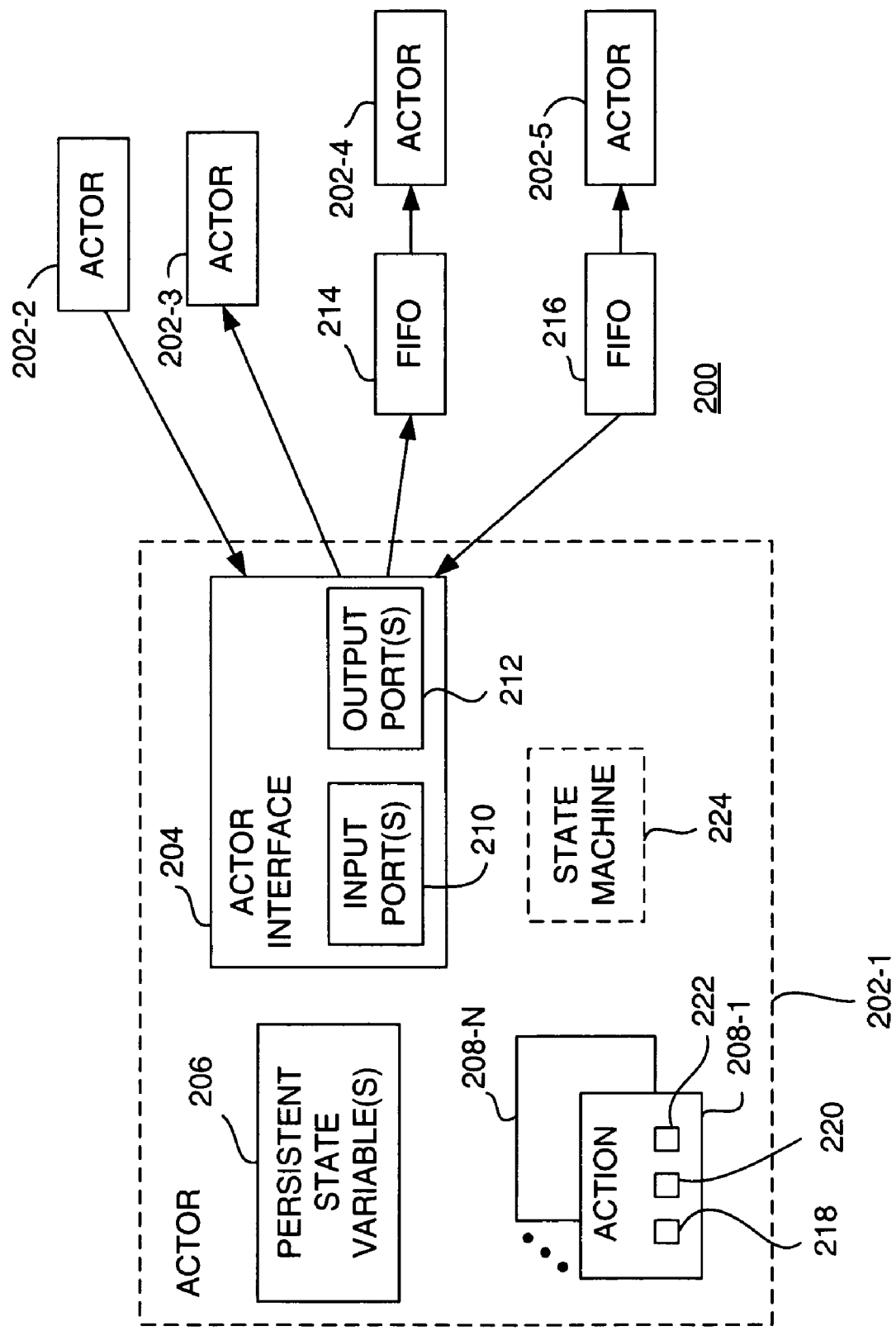
FIG. 2 is a block diagram depicting an exemplary embodiment of a program language description of a circuit design defined in accordance with one or more aspects of the invention.

In particular, FIG. 2 is a block diagram depicting an exemplary embodiment of a program 200 defined in accordance with one or more aspects of the invention. The program 200 illustratively includes actors 202-1 through 202-5. For clarity, only the actor 202-1 is shown in detail. It is to be understood that the actors 202-2 through 202-5 are similar to the actor 202-1. The actor 202-1 includes an actor interface 204, persistent variables 206, and actions 208-1 through 208-N (collectively referred to as actions 208), where N is an integer greater than zero. The actor interface 204 may include one or more input ports 210 and one or more output ports 212. In some cases, the actor interface 204 may include only the output ports 212. In some other cases, the actor interface 204 may include only the input ports 210. In the present example, the actor interface 204 may receive tokens directly from the actor 202-2 and provides tokens directly to the actor 202-3. The actor interface 204 provides tokens to the actor 202-4 through a first-in-first-out memory (FIFO) model 214, and receives tokens from the actor 202-5 through a FIFO model 216. In terms of physical implementation, the circuit that implements the actor 202-1 communicates with the circuits that implement the actors 202-2 and 202-3 synchronously and the circuits that implement the actors 202-4 and 202-5 asynchronously. The program 200 need not specify the storage mechanism of the communication channels. The programmer can assume that the channel depth is infinite. Automatic or manual analysis of the actor network may be used to determine the required channel depths for correct program operation.

The persistent variables 206 store the state of the actor 202-1. The values of the persistent variables 206 are readable and writeable by any of the actions 208. Notably, the persistent variables 206 have actor-scope in that they are accessible only from within the actor 202-1. In terms of actual physical implementation, the persistent variables 206 may be registers or multi-port memories with associated controls and multiplexing logic.

Each of the actions 208 is configured to read some number of tokens from various ones of the input ports 210 and write some number of tokens to various ones of the output ports 212. Alternatively, an action may be configured to just read tokens from input ports and produce no output tokens, or an action may be configured to just write tokens to output ports and receive no input tokens. In any case, each of the actions 208 includes firing rule data 218 that dictates when the action may "fire" (i.e., execute its described operation). In one embodiment, an action only fires if the necessary input tokens are present at the input ports 210 ("default firing rule"). Alternatively, or in addition to the default firing rule, an action may fire based on one or more guard conditions that must be true for the action to fire. Guard conditions may be Boolean expressions that test any persistent state variable of the actor or input token.

Each of the actions 208 may also include one or more local variables 220. The value of the local variables 220 do not persist from firing to firing, but may be used to hold temporary or intermediate results during execution of a particular firing. Each of the actions 208 may include procedural instruction data 222. The procedural instruction data 222 includes a sequence of instructions that is executed during a firing. Notably, the simplest action merely copies from an input to an output and thus has no procedural instruction data 222. The procedural instruction data 222 may include various constructs, such as assignments, flow control (e.g., if/else, loops), and the like.

Notably, each firing of an action is atomic. That is, no other action may read or write to any resource that is written to or read by an action whose firing is already underway (including the use of resources in guard conditions). Provided that the rule of atomicity is observed, multiple actions are permitted to execute concurrently. In this manner, the program 200 employs a concurrent programming model.

An action may implement state-machine like behavior using the procedural instruction data 222 by modifying persistent variables of the actor 202-1 and testing them in guard conditions. In one embodiment, the actor 202-1 may include a state machine declaration 224. The state machine declaration 224 declares a state machine in finite state machine (FSM) form by an initial state and any number of state transitions that accompany the firing of one or more of the actions 208. The source states for the transitions become additional requirements for the action firings that are logically ANDed with the other firing rules, described above.

Returning to FIG. 1, the program 116 is processed by the parser 104. The parser 104 converts the program 116 into an intermediate representation 117 that describes the program. In one embodiment, the intermediate representation 117 includes an extensible markup language (XML) representation. XML is a convenient intermediate representation, since the transformation steps described below can be implemented using an extensible stylesheet language transformation (XSLT). As is well known in the art, XSLT is a syntax for describing transformations on XML documents that produce either other XML documents or arbitrary text output.

The intermediate representation 117 is processed by the program analyzer 112 to produce a transformed representation 119. The program analyzer 112 performs analyses that assist in HDL code generation. In one embodiment, the program analyzer 112 processes the intermediate representation 117 using the following analyses: The program analyzer 112 identifies the names and data types of all the input ports and output ports for the actors. For each of the input ports, the name and data type is annotated with a list of all the actions that examine or read the input. For each of the output ports, the name and data type is annotated with a list of all the actions that write the output. The program analyzer 112 identifies the names and data types of the persistent variables of each of the actors. For each of the persistent variables, the name and data type is annotated with a list of all the actions that read from or write to the variable.

The program analyzer 112 identifies the name of each of the actions. For each action, the name is annotated with: (1) a list of any guard conditions; (2) a list of any local variable declarations; (3) a list of any state transitions that are caused by a firing; (4) a list of local variable aliases that refer to tokens read from input ports; (5) a list of expressions that are to be computed and written as tokens to output ports; (6) a list of statements to be executed upon firing after reading inputs, but before writing outputs; and (7) a sensitivity list. A sensitivity list is a list of all external (to the action) variables and input ports that affect the action result.

In one embodiment, the above analyses are described in XSLT and applied to the XML intermediate representation produced by the parser 104. The program analyzer 112 is an XSLT processor, which produces the transformed representation 119. The transformed representation 119 is an XML document that describes the programming constructs used in the program 116 in manner that is useful for the HDL code generator 106. In particular, the transformed representation 119 includes a hierarchy of elements that classify the various programming constructs specified in the program 116 in accordance with the above-described analyses. The transformed representation 119 is also referred to herein as an XHDL document.

In another embodiment, the functions of the parser 104 and the program analyzer 112 may be performed by a compiler, which generates an internal database representation of the program 116 that is equivalent to an XML representation. In this case, procedural program code of the compiler transforms the internal database to produce the transformed representation 119 similar to an XSLT processor.

In particular, FIG. 3 illustrates an exemplary embodiment of a hierarchy 300 in a transformed representation in accordance with one or more aspects of the invention. In the present example, the hierarchy 300 describes a single actor in the program 116. For purposes of clarity, the hierarchy 300 is shown as a template and does not include values for the various attributes defined in the elements. It is to be understood that values for the attributes are determined based on the specific constructs in the program 116. An exemplary program and XHDL document is shown below. An "element" as used herein refers to everything from the element's start tag (e.g., <xhdl_actor>) to the element's end tag, if included (e.g., </xhdl_actor>). For clarity, reference numerals for elements of the hierarchy 300 point to the start tag.

An element 302 includes an attribute identifying the name of the actor. Child elements of the element 302 include an element 304 for an input port of the actor, an element 306 for an output port or the actor, an element 308 for a generic defined in actor, and element 310 for a variable defined in the actor, an element 312 for a state machine defined in the actor, and an element 314 for an action defined in the actor. Although only one of each type of child element is shown, it is to be understood that the element 302 may include multiple child elements of these types (e.g., multiple input port child elements).

The input port element 304 includes attributes identifying the name and data type of the input port. The input port element 304 includes an element 316 for an action that reads this input port ("action-reference element"). The action reference element 316 includes attributes for the name and index of the action that reads the input port. Similarly, the output port element 306 includes attributes for identifying the name and data type of the output port, as well as an action-reference element 318 for an action that writes to this output port. It is to be understood that the input port element 304 and the output port element 306 may include multiple action reference elements.

The generic element 308 includes attributes for identifying the generic defined in the actor. The variable element 310 includes attributes for identifying the name and type of the variable defined in the actor. The variable element 310 includes an action reference element 324. The variable element 310 optionally includes an element 320 for initializing the variable ("initialization element"). The initialization element 320 includes an element 322 having an attribute identifying the string expression in the actor that initialized the variable ("string expression element"). Note that the variable element 310 may include more than one action reference element.

The state machine element 312 is optional and is included only if the actor includes a state machine declaration. The state machine element 312 includes an attribute identifying the initial state, as well as an element 325 having an attribute that identifies the name of a state ("state element"). Note that the state machine element 312 may have more than one state element.

The action element 314 includes attributes identifying the name and index of the action in the actor. Child elements of the action element 314 may include one or more of: an element 326 for a state transition ("state transition element"), an element 328 for a guard condition ("guard element"), an element 330 for a port alias ("port alias element"), an element 332 for a computation of output ("compute output element"), an element 334 for a statement declaration ("statement element"), and an element 336 for sensitivity ("sensitivity element"). The state transition element 326 includes a from-state element 337 having an attribute identifying a state name and a to-state element 338 having an attribute identifying a state name. The action element 314 may include more than one state transition element. The guard element 328 includes a string expression element 340. The guard element 328 may include more than one string expression element. The port alias element 330 includes attributes identifying the name of the alias and the name of the port to which the alias corresponds. The action element 314 may include more than one port alias element. The compute output element 332 includes an attribute identifying an output port and a string expression element 342. The compute output element 332 may include more than one string expression element. The sensitivity element 336 includes an attribute for the name of a variable.

The statement element 334 includes an attribute identifying the type of the statement (e.g., if statement, assign statement, etc.). The statement element 334 includes one or more additional elements 344, depending on the type of statement. For example, an "if" statement may include an element <xhdl_test>, which in turn includes one or more string expression elements denoting the particular test. An "assign" statement may include one or more string expression elements denoting the assignment. Those skilled in the art will appreciate that other types of statements may be described using the statement element, each of which include various child elements, similar to those detailed above (e.g., string expression elements).

For example, the following is an exemplary program written using the CAL language that describes an actor named UVSelect: actor UVSelect [UINT8] (positive LINE_WIDTH) UINT8 UVA, UINT8 UVB==>UINT8 UV:
  UINT9 col=0;
  copyA: action UVA: [val] ==> UV: [ val ]
    guard
      col < LINE_WIDTH/2
    do
      col :=col + 1;
    end
  copyB: action UVB: [val] ==> UV: [ val ]
    guard
      col >= LINE_WIDTH/2
    do
      col := col + 1;
      if col = LINE_WIDTH then
        col := 0;
      end
    end
end A transformed representation in XML of the above exemplary program is as follows:

```
<?xml version="1.0" encoding="UTF-8" standalone="no"?>
<xhdl-actor name="UVSelect">
  <xhdl-input-port name="UVA" type="UINT8">
    <xhdl-action-ref tag="copyA" index="0"/>
  </xhdl-input-port>
  <xhdl-input-port name="UVB" type="UINT8">
    <xhdl-action-ref tag="copyB" index="1"/>
  </xhdl-input-port>
  <xhdl-output-port name="UV" type="UINT8">
    <xhdl-action-ref tag="copyA" index="0"/>
    <xhdl-action-ref tag="copyB" index="1"/>
  </xhdl-output-port>
  <xhdl-generic name="LINE_WIDTH" type="positive"/>
  <xhdl-variable name="col" type="UINT9">
    <xhdl-initialize>
      <xhdl-expr string="0"/>
    </xhdl-initialize>
    <xhdl-action-ref index="0" tag="copyA"/>
    <xhdl-action-ref index="1" tag="copyB"/>
  </xhdl-variable>
  <xhdl-action tag="copyA" index="0">
    <xhdl-guard>
      <xhdl-expr string="col < (LINE_WIDTH/2)"/>
    </xhdl-guard>
    <xhdl-port-alias name="val" port="UVA"/>
    <xhdl-compute-output port="UV">
      <xhdl-expr string="val"/>
    </xhdl-compute-output>
    <xhdl-statement type="assign" var="col">
      <xhdl-expr string="col + 1"/>
    </xhdl-statement>
    <xhdl-sense name="val"/>
    <xhdl-sense name="col"/>
  </xhdl-action>
  <xhdl-action tag="copyB" index="1">
    <xhdl-guard>
      <xhdl-expr string="col >= (LINE_WIDTH/2)"/>
    </xhdl-guard>
    <xhdl-port-alias name="val" port="UVB"/>
    <xhdl-compute-output port="UV">
      <xhdl-expr string="val"/>
    </xhdl-compute-output>
    <xhdl-statement type="assign" var="col">
      <xhdl-expr string="col + 1"/>
    </xhdl-statement>
```

-continued

```
    </xhdl-statement>
    <xhdl-statement type="if">
      <xhdl-test>
        <xhdl-expr string="col = LINE_WIDTH"/>
      </xhdl-test>
      <xhdl-statement type="assign" var="col">
        <xhdl-expr string="0"/>
      </xhdl-statement>
    </xhdl-statement>
    <xhdl-sense name="val"/>
    <xhdl-sense name="col"/>
  </xhdl-action>
</xhdl-actor>
```

Returning to FIG. 1, the transformed representation 119 includes all the pertinent information from the program 116 required to generate an HDL representation. Notably, the transformed representation 119 is processed by the translator 106 to produce an HDL representation 121. The translator 106 translates the hierarchy of elements in the transformed representation 119 to a computationally equivalent hierarchy of HDL constructs that implement the network of processes and channels of the circuit design in hardware. For purposes of clarity by example, the translator 106 is described below as producing VHDL code. It is to be understood, however, that the translator 106 may be configured to produce other types of HDL code from the transformed representation 119, such as VERILOG code.

The HDL representation 121 includes an entity declaration and an architecture definition for each actor of the program 116 (i.e., each process of the circuit design). In the entity declaration, the interface to the hardware form of an actor is defined to include generic parameters (e.g., from generic elements in the transformed representation 119), data inputs (e.g., from input port elements in the transformed representation 119), and data outputs (e.g., from output port elements in the transformed representation 119). The entity declaration also includes a clock input (local clock reference) and a reset input (network-wide reset to initialize all actors). Notably, it is necessary to generate a data transfer protocol to control data flow, an exemplary embodiment of which is described immediately below.

Figure 4:
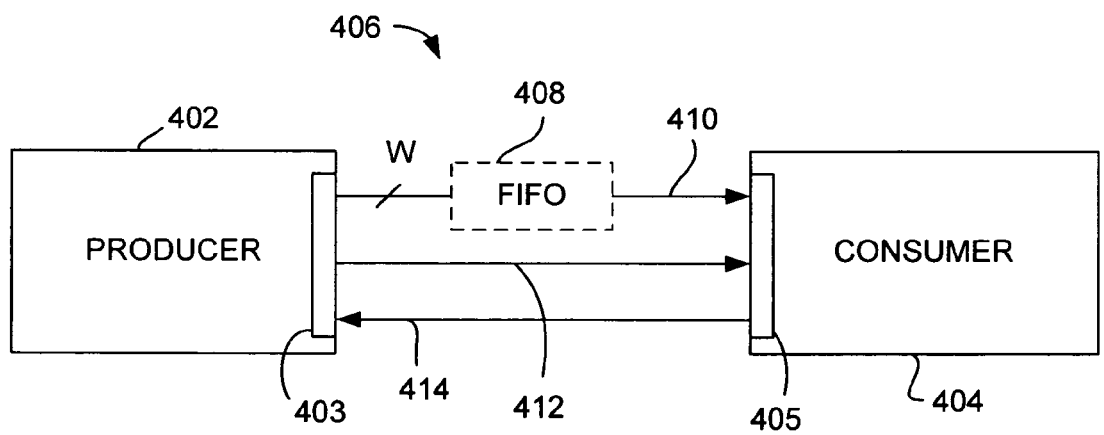
FIG. 4 is a block diagram depicting an exemplary embodiment of an inter-process communication protocol in accordance with one or more aspects of the invention.

FIG. 4 is a block diagram depicting an exemplary embodiment of an inter-process communication protocol 400 in accordance with one or more aspects of the invention. The inter-process communication protocol 400 ("protocol 400") provides a semi-synchronous protocol that enables the transfer of a token, if available, on every clock cycle between a producer process ("producer 402") and a consumer process ("consumer 404") via a channel 406. The protocol 400 provides an indication to the producer of the availability of channel capacity, and to the consumer of waiting tokens. The protocol 400 operates either when two processes (producer 402 and consumer 404) are directly connected (i.e., the channel 406 is a direct connection), or when they are connected through a FIFO (i.e., the channel 406 includes a FIFO 408).

In particular, the channel 406 includes a data bus 410 (token bus) of width w, a send control line 412, and an acknowledge control line 414, where w is a positive integer. The data bus 410 may directly couple an interface of the producer 402 ("producer interface 403") and an interface of the consumer 404 ("consumer interface 405"), or may include the FIFO 408. The producer interface 403 produces a control signal on the send control line 412 that changes on a clock edge to signal that a valid token is on the data bus 410. The consumer interface 405 produces a control signal on the acknowledge control line 414 to indicate that valid data will be accepted on the next clock edge (i.e., the producer 402 may change the token value at that clock edge). The control signal of the acknowledge control line 414 is asynchronous, but must be stable within a certain time of the next clock edge. This "setup time" is defined by the time the producer 402 needs to prepare a response at that next clock edge. It is an error for the acknowledge signal to be asserted if the send signal is not asserted at a clock edge. This is indicative of a hardware failure or design error and the condition can be trapped either in simulation or with dedicated monitoring hardware in an actual implementation (shown below in FIG. 5).

Figure 5:
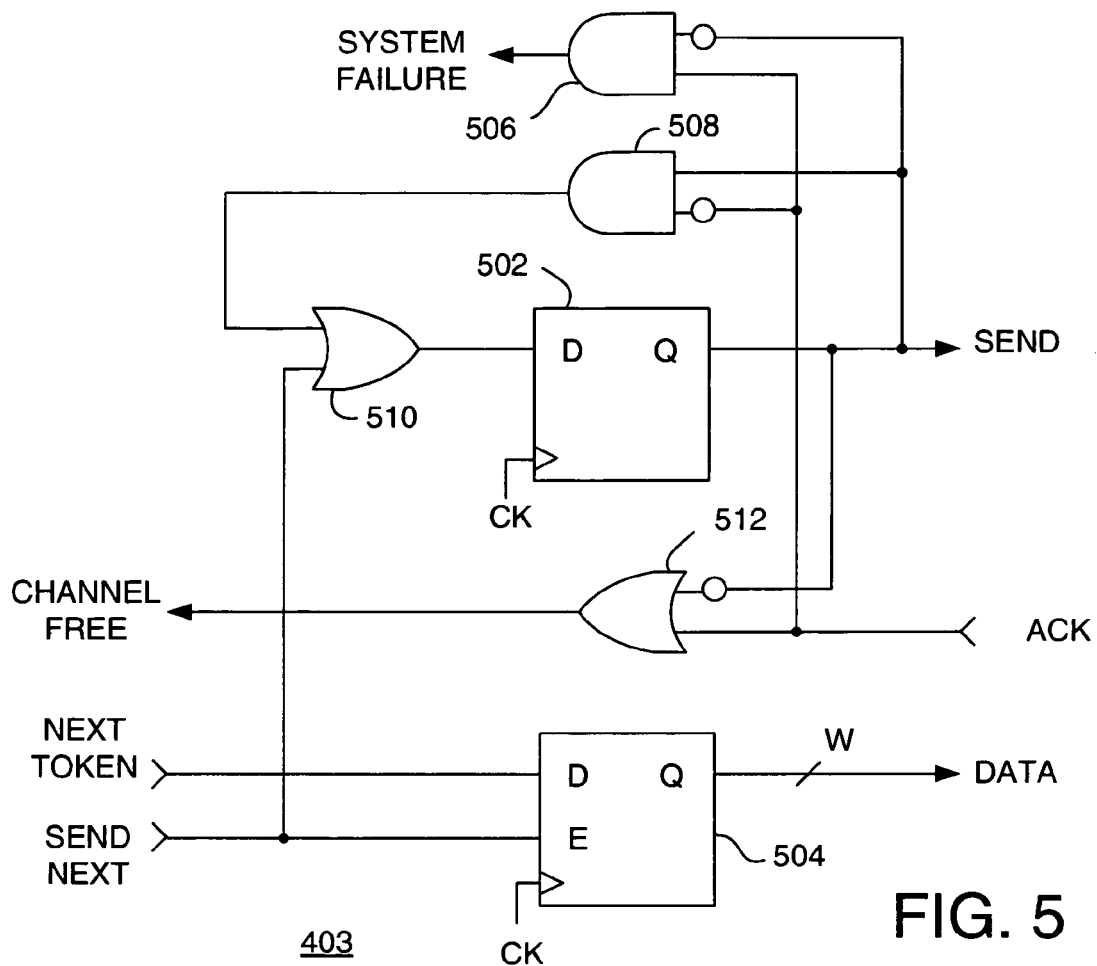
FIG. 5 is a block diagram depicting an exemplary embodiment of a producer interface of FIG. 4 in accordance with one or more aspects of the invention.

FIG. 5 is a block diagram depicting an exemplary embodiment of the producer interface 403 in accordance with one or more aspects of the invention. The producer interface 403 includes a flip-flop 502, a flip-flop 504, an AND gate 506, and AND gate 508, and OR gate 510, and an OR gate 512. Each of the flip-flops 502 and 504 include a clock terminal for receiving a clock signal (CK). An output terminal of the flip-flop 502 generates the send signal for transmission over the send control line 412. An input terminal of the OR gate 512 receives the acknowledge signal (received over the acknowledge control line 414), and an inverted input terminal of the OR gate 512 receives the send signal. The OR gate 512 generates a signal indicative of whether the channel 406 is free ("channel free" signal). That is, the channel 406 is not free (the output of the OR gate 512 is not asserted) if the acknowledge signal is not asserted and the send signal is asserted. The channel 406 is free otherwise. In the present embodiment, the channel free signal is asserted if there is capacity to write a new token to the channel 406. Note that in the present embodiment, an asserted signal has a high logic level. A data input terminal of the flip-flop 504 receives the next token to be transmitted, and a data output terminal of the flip-flop 504 couples a token to the data bus 410. An enable terminal of the flip-flop 504 receives a signal indicative of whether a next token is to be sent ("send-next signal"), which is generated by the producer 402. If the send-next signal is asserted, the flip-flop 504 is enabled and the next token will be loaded into the flip-flop 504 on the next clock edge.

An input terminal of the AND gate 506 receives the acknowledge signal, and an inverted input terminal of the AND gate 506 receives the send signal. An output terminal of the AND gate 506 provides a system failure signal. As stated above, it is an error for the acknowledge signal to be asserted if the send signal is not asserted at a clock edge, such being indicated by the system failure signal. An input terminal of the AND gate 508 receives the send signal, and an inverted input terminal of the AND gate 508 receives the acknowledge signal. An output terminal of the AND gate 508 is coupled to an input terminal of the OR gate 510. Another input terminal of the OR gate 510 receives the send-next signal. Thus, the flip-flip 502 is loaded with an asserted value at a clock edge if the send-next signal is asserted or if the acknowledge signal is not asserted and the send signal is asserted. The flip-flop 502 is loaded with a de-asserted value otherwise (a logic low value). Although the producer interface 403 is shown as having two AND gates and two OR gates, it is to be understood that various other combinatorial logic configurations can be used comprises various types of logic gates.

Figure 6:
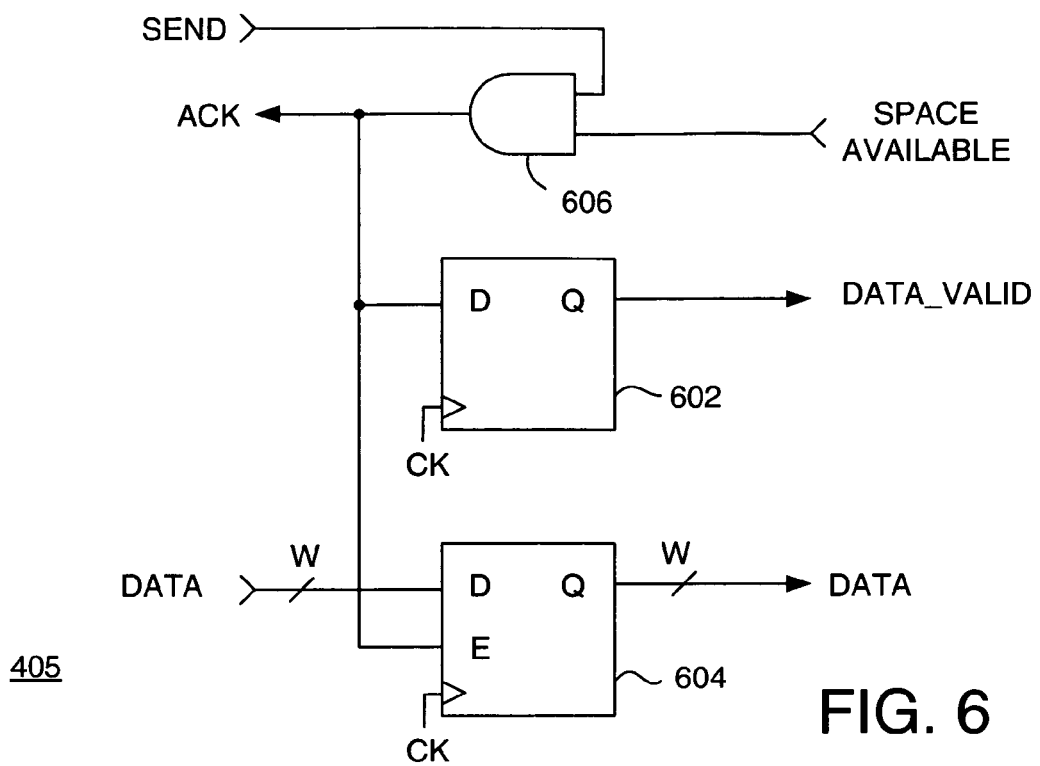
FIG. 6 is a block diagram depicting an exemplary embodiment of a consumer interface of FIG. 4 in accordance with one or more aspects of the invention.

FIG. 6 is a block diagram depicting an exemplary embodiment of the consumer interface 405 in accordance with one or more aspects of the invention. The consumer interface 405 includes a flip-flop 602, a flip-flop 604, and an AND gate 606. Input terminals of the AND gate 606 respectively receive a space-available signal and the send signal from the send control terminal 412. The space-available signal is generated by the consumer 404 to indicate its readiness to accept another token. An output terminal of the AND gate 606 provides the acknowledge signal. A data input terminal of the flip-flop 602 receives the acknowledge signal, and a data output terminal of the flip-flop 602 provides a data-valid signal. The data-valid signal may be used to advance the state of the consumer 404 (e.g., as a firing mechanism). A data input terminal of the flip-flop 604 receives tokens from the data bus 410, and a data output terminal of the flip-flop 604 provides tokens to the consumer 404. An enable terminal of the flip-flop 604 receives the acknowledge signal. Thus, the flip-flop 604 is loaded with data on a clock edge only if the acknowledge signal is asserted. The acknowledge signal is asserted if the send signal is asserted and the space-available signal is asserted.

The flip-flops 602 and 604 each include a clock terminal for receiving a clock signal (CLK). If the producer 402 is directly connected to the consumer 404, the clock signal CK in the producer interface 403 is the same as the clock signal CLK in the consumer interface 405. If the producer 402 is connected to the consumer 404 through the FIFO 408, the clock signal CK in the producer interface 403 may have a different frequency than that of the clock signal CLK in the consumer interface 405.

The inter-process communication protocol 400 allows for reduced hardware cost and efficient use of clock cycles. There can be a transfer of a token on every clock cycle, as opposed to a fully synchronous handshake mechanism. The inter-process communication protocol 400 is suited for a process network, where scheduling and process control is distributed and effectively achieved by triggering process actions based on token availability. In addition, the inter-process communication protocol 400 operates with direct producer-to-consumer connections, as well as producer-FIFO-consumer connections, which allows for more network implementation options. The inter-process communication protocol 400 can be implemented using programmable logic of an FPGA, for example, or could be implemented as a hard primitive on any system-on-chip (SoC) or application specific integrated circuit (ASIC).

Returning to FIG. 1, the above-described inter-process communication protocol may be used as a data transfer protocol between two actors (processes) in the physically implemented circuit design. Thus, two signals are added for each data input port and each data output port (e.g., a send control signal and an acknowledge control signal) in the entity declaration of the HDL representation 121.

Figure 7:
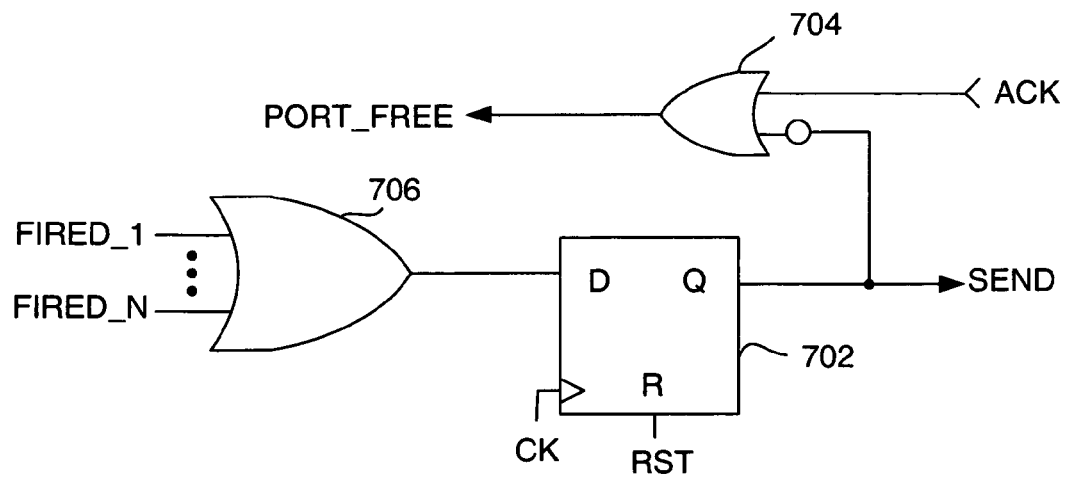
FIG. 7 is a schematic diagram depicting an a portion of an equivalent HDL behavioral construct for an output port in accordance with one or more aspects of the invention.

The architecture definition of the HDL representation 121 includes the detailed synthesizable code that defines the actor hardware. There are a number of internal actor signals that must be declared in the architecture definition. An enumerated type representing states may be created if the actor includes a state machine, along with a constant set to the value of the initial (reset) state. For each output port, a behavioral construct equivalent to the schematic 700 of FIG. 7 is defined in a process statement. The schematic 700 includes a flip-flop 702, an OR gate 704, and an OR gate 706. Input terminals of the OR gate 706 respectively receives signals denoted as $fired_1$ through $fired_N$ (where N is an integer greater than one). The "fired" signals are action firing flags for all the actions that write to the output port, such information being annotated in the transformed representation 119. An output terminal of the OR gate 706 is coupled to a data input terminal of the flip-flop 702. A data output terminal of the flip-flop 702 is coupled to an inverted input terminal of the OR gate 704. An input terminal of the OR gate 704 receives an acknowledge signal that is received over the communication channel to which the output port is coupled, as described above. An output terminal of the OR gate 704 provides a port-free signal.

Figure 8:
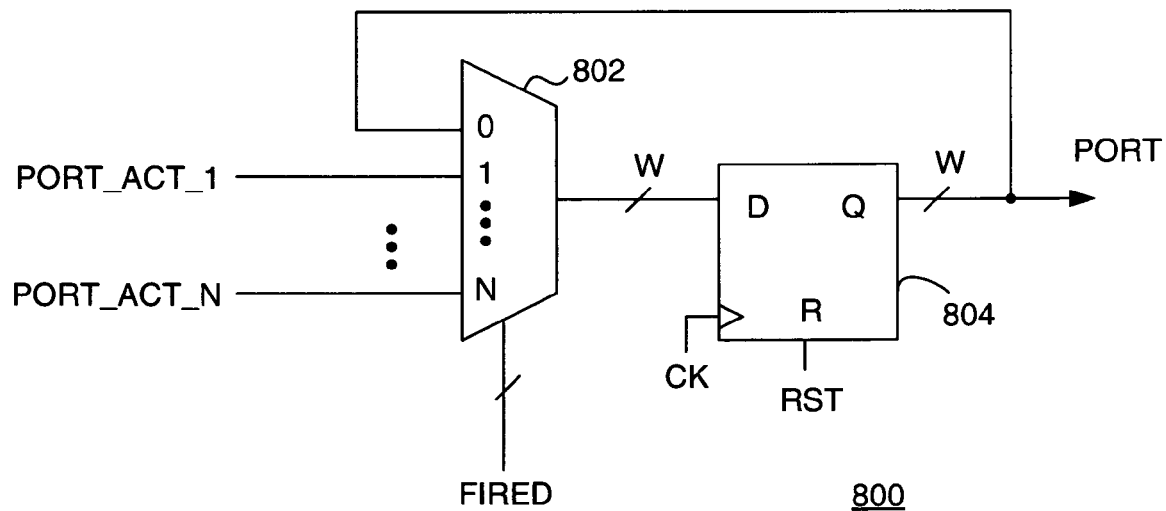
FIG. 8 is a schematic diagram depicting another a portion of an equivalent HDL behavioral construct for an output port in accordance with one or more aspects of the invention.

In addition, for each output port, a behavioral construct equivalent to the schematic 800 of FIG. 8 is defined in a process statement. The schematic 800 includes a multiplexer 802 and a flip-flop 804. Input terminals of the multiplexer 802 respectively receive data generated by the actions that write to the output port. An output terminal of the multiplexer 802 is coupled to an input terminal of the flip-flop 804. An output terminal of the flip-flop 804 provides a data output for the output port and is coupled to another input terminal of the multiplexer 802. The flip-flop 804 provides an output register for the output port to provide tokens. The multiplexer 802 is controlled by signals denoted as "fired", which is the index to the currently fired action. The fired signal causes the multiplexer 802 to select the specific output value for the output port that is produced by the fired action. If no action is fired, the flip-flop 804 contents are unchanged. The schematics 700 and 800 collectively provide an implementation of the inter-process communication protocol 400 described above with respect to FIG. 4.

Figure 9:
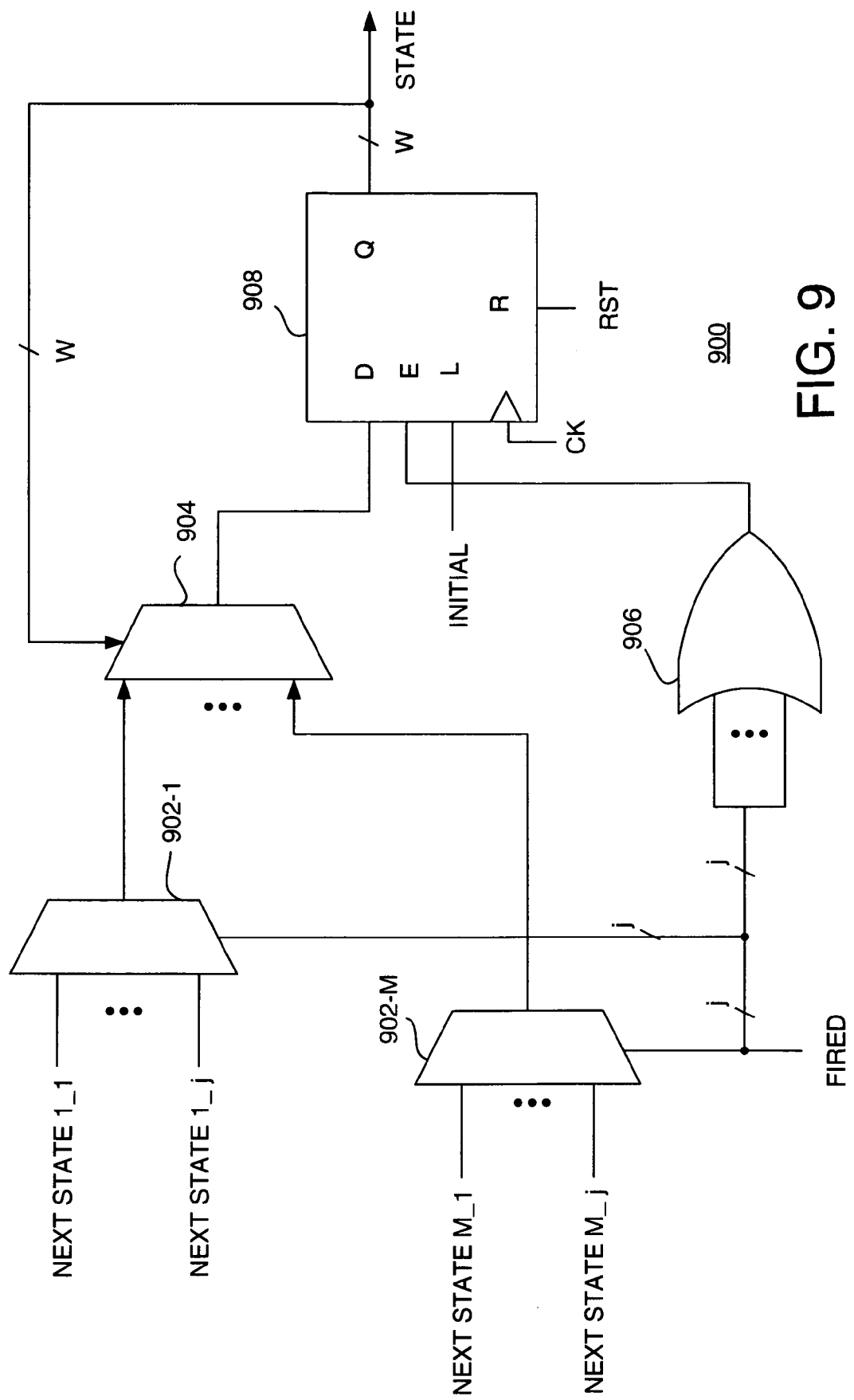
FIG. 9 is a schematic diagram depicting an equivalent HDL behavioral construct for a state machine in accordance with one or more aspects of the invention.

If the actor includes a state machine, a behavioral construct equivalent to the schematic 900 of FIG. 9 is defined in a process statement. The schematic includes a multiplexers 902-1 through 902-M (collectively referred to as multiplexers 902), a multiplexer 904, an OR gate 906, and a flip-flop 908. A reset terminal of the flip-flop receives a reset signal (RST). A clock terminal of the flip-flop 908 receives a clock signal (CK). An initialization terminal of the flip-flop 908 receives an initial value signal. The flip-flop 908 has an asynchronous load capability so that on reset, it is set to the initial value. An enable terminal of the flip-flop 908 is coupled to an output terminal of the OR gate 906. Input terminals of the OR gate receive action firing flags ("fired" signals). When the flip-flop 908 is not reset, it data is only loaded therein when an action fires (i.e., the output of the OR gate will be asserted if an action firing flag is true.

The state transition behavior is schematically shown as a two stage multiplexer. Note that the actual state transition behavior may be described by a VHDL case statement. An output terminal of the multiplexer 904 is coupled to a data input terminal of the flip-flop 908. A control terminal of the multiplexer 904 is coupled to the data output terminal of the flip-flop 908. Input terminals of the multiplexer 904 are respectively coupled to output terminals of the multiplexers 902-1 through 902-M. Control terminals of the multiplexers 902 receive the fired signals. Input terminals of the multiplexers 902 receive next state signals for the appropriate actions (M possible states, J actions). The multiplexer 904 selects a next state value based on the current state. The multiplexer 902 selects the next state from the current states based on which action is fired.

Figure 10:
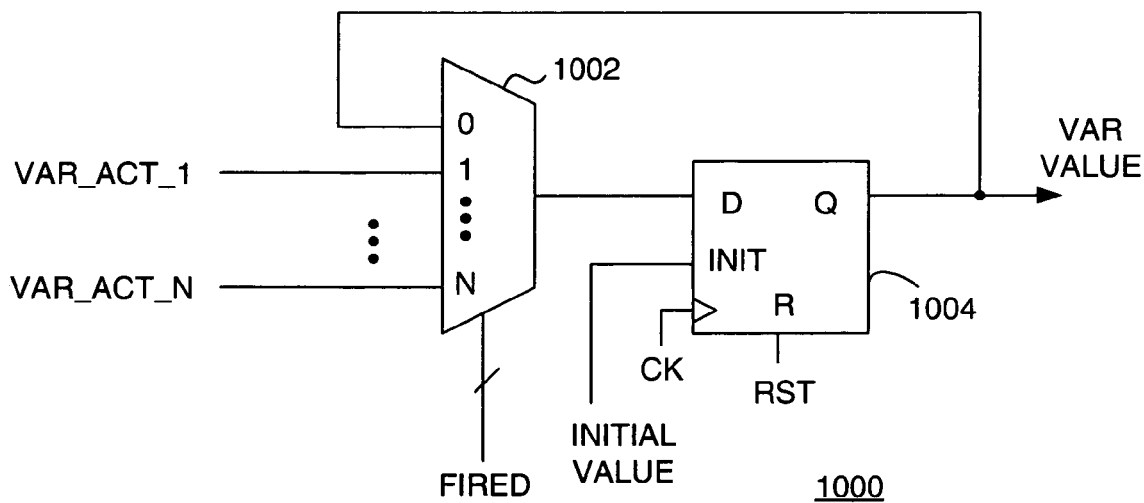
FIG. 10 is a schematic diagram depicting an equivalent HDL behavioral construct for a persistent variable in accordance with one or more aspects of the invention.

For persistent variables of the actor, a behavioral construct equivalent to the schematic 1000 of FIG. 10 is defined in a process statement. The schematic 1000 includes a multiplexer 1002 and a flip-flop 1004. The flip-flop 1004 includes a clock terminal for receiving a clock signal (CK), a reset terminal for receiving a reset signal (RST), and an initializer terminal for receiving an initial signal. A data input terminal of the flip-flop 1004 is coupled to an output terminal of the multiplexer 1002. A data output terminal of the flip-flop 1004 is coupled to an input terminal of the multiplexer 1002 and provides the value of the variable as selected by the multiplexer 1002. A control terminal of the multiplexer 1002 receives the fired signals. Inputs to the multiplexer 1002 respectively receive signals from actions that modify the value of the variable, such information being annotated in the transformed representation 119. The flip-flop 1004 may be asynchronously loaded at reset time with an optional initializer (obtained from the transformed representation 119). The select port of the multiplexer 1002 determines which new value will be loaded into the flip-flop 1004. When no relevant actions are fired, the value of the flip-flop 1004 is fed back to its data input, causing its value to remain unchanged.

Actions may be defined using VHDL process statements. Statements from the action body of the actor source code are copied into the process statement body and combinatorial logic is produced using a standard synthesis tool. References to external (actor scope) variables that are managed as shown above in FIG. 10 are shadowed in the process block's declarative part to keep the distinction between current value and the new value that results from action firing. Action process statements must have a sensitivity list, which is obtained from the transformed representation 119. In the actor source, tokens are read from input ports and referred to within the action body through a local variable that is replaced with its token value. In VHDL, the alias feature is used to accomplish this substitution.

The form of the action process is:

process (sensitivity list) is
  -- create alias for the token values used by the action, relating the name
  -- of the token to the input port it is read from alias token_vari is input_port_namej;
  . . . .
  -- declare local variable for the current value of actor state variables variable actor_vark: type;
  . . . .
begin
  -- assign the current values of actor state variables from the state variable register actor_vark := actor_var_regk;
  . . . compute guard expression . . .
  . . . compute action statements . . .
  -- assign the updated value of actor state variable to the appropriate mux input actor_vark_actionj <= actor_var_k;
  . . . .
  -- assign the output token value to the appropriate output port mux output_namel_actionj <= . . . expression . . . ;
  . . . .
end process;

Note that the above format for the action process is for an elementary form of actor that reads at most one token, writes at most one token, and whose firing can be implemented as a combinatorial expression (i.e., no loops, flow control, or access to addressable memories). Those skilled in the art will appreciate that more complex action processes may be used that read more than one token, write more than one token, and/or whose firing may include loop constructs, flow control constructs, and addressable memory constructs.

Returning to FIG. 1, the synthesizer 108 processes the HDL representation 121 to produce a synthesized representation 123. The synthesizer 108 is configured to synthesize the HDL code using a well known synthesis algorithm. The physical implementation module processes the synthesized representation 123 to produce physical implementation data 125. The physical implementation data 125 may be used to configure an integrated circuit with the specified circuit design. For example, if the target platform is an FPGA, the physical implementation module 110 comprises conventional map, place, and route tools, as well as a bitstream generation tool that generates a configuration bitstream to be loaded in the FPGA.

Figure 11:
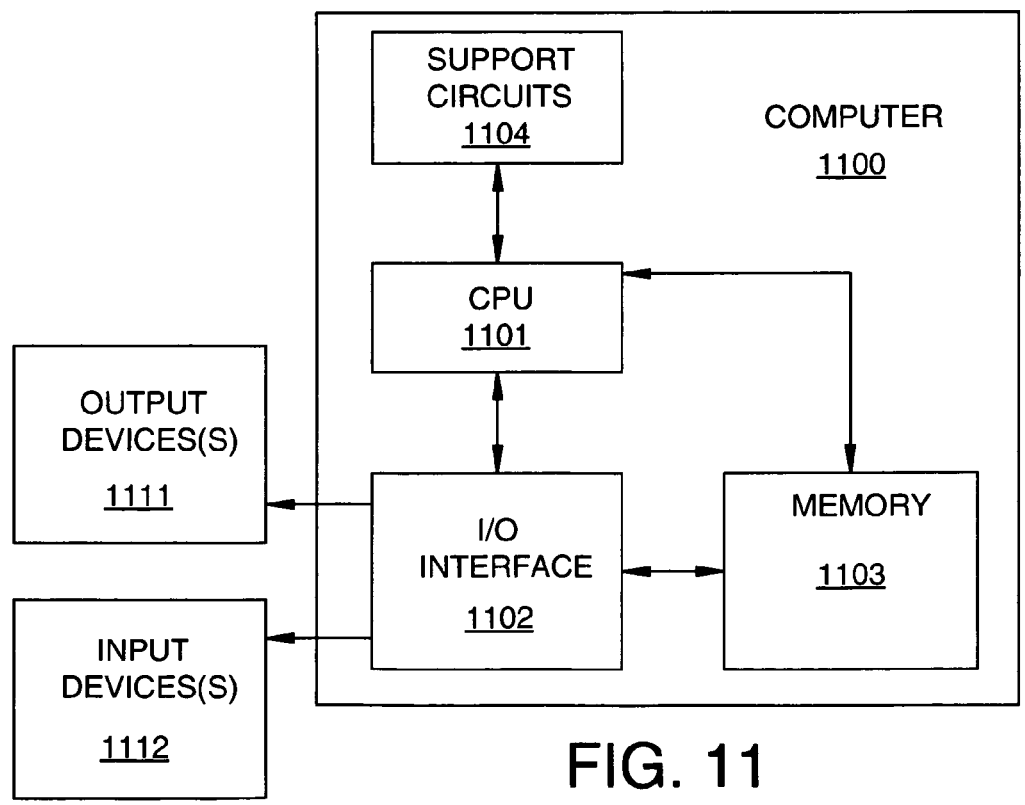
FIG. 11 is a block diagram depicting an exemplary embodiment of a computer suitable for implementing the processes and methods described herein.

FIG. 11 is a block diagram depicting an exemplary embodiment of a computer 1100 suitable for implementing the processes and methods described herein. Notably, the computer 1100 may be used to implement the design system 100 of FIG. 1. The computer 1100 includes a processor 1101, a memory 1103, various support circuits 1104, and an I/O interface 1102. The processor 1101 may be any type of microprocessor known in the art. The support circuits 1104 for the processor 1101 include conventional cache, power supplies, clock circuits, data registers, I/O interfaces, and the like. The I/O interface 1102 may be directly coupled to the memory 1103 or coupled through the processor 1101. The I/O interface 1102 may be coupled to various input devices 1112 and output devices 1111, such as a conventional keyboard, mouse, printer, display, and the like.

The memory 1103 stores all or portions of one or more programs and/or data to implement the system 100. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 1100 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 1103. The memory 1103 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of implementing a circuit design for an integrated circuit, comprising:

specifying a program using a concurrent programming language, the program including programming constructs that define a plurality of processes and a plurality of communication channels; parsing the program to generate an intermediate representation;

generating a hierarchy of elements of the circuit design according to input ports and output ports that classify the programming constructs defining the interconnection of the plurality of processes by the plurality of communication channels of the program to produce a transformed representation; wherein the transformed representation is produced using the intermediate representation;

generating a hardware description language (HDL) representation of the circuit design from the transformed representation by translating the hierarchy of elements to a hierarchy of HDL constructs that implements the plurality of processes and the plurality of communication channels in hardware synthesizing the HDL representation; and generating physical implementation data for the integrated circuit from the HDL representation as synthesized.

2. The method of claim 1, wherein the integrated circuit comprises a programmable logic device (PLD), and where the physical implementation data comprises configuration data for the PLD.

3. The method of claim 1, wherein the intermediate representation and the transformed representation comprise extensible markup language (XML) documents, and wherein the hierarchy of elements is generated using an extensible stylesheet language transformation (XSLT).

4. The method of claim 1, wherein the programming constructs, for each of the plurality of processes, define at least one of: (a) an interface having one or more ports; (b) persistent state variables; (c) a state machine; or (d) one or more actions, each of the one or more actions defined by procedural instruction data and firing rule data for triggering the procedural instruction data.

5. The method of claim 4, wherein the hierarchy of elements includes an element for each of the one or more ports, an element for each of the persistent state variables, an element for the state machine, and an element for each of the one or more actions.

6. The method of claim 1, wherein the programming constructs, for each of the plurality of communication channels, define a connection for propagating tokens from at least one first process of the plurality of processes to at least one second process of the plurality of processes.

7. The method of claim 5, wherein the connection defining at least one of the plurality of communication channels is modeled using a first-in-first-out memory (FIFO).

8. The method of claim 1, wherein each of the plurality of communication channels includes a data bus, a send control line, and an acknowledge control line.

9. Apparatus for implementing a circuit design for an integrated circuit, comprising:

an input module for specifying a program using a concurrent programming language, the program including programming constructs that define a plurality of processes and a plurality of communication channels; a parser for parsing the program to generate an intermediate representation;

a program analyzer for generating a hierarchy of elements of the circuit design according to input ports and output ports that classify the programming constructs defining the interconnection of the plurality of processes by the plurality of communication channels of the program to produce a transformed representation; wherein the program analyzer produces the transformed representation using the intermediate representation;

a translator for generating a hardware description language (HDL) representation of the circuit design from the transformed representation by translating the hierarchy of elements to a hierarchy of HDL constructs that implements the plurality of processes and the plurality of communication channels in hardware a synthesizer for synthesizing the HDL representation; and a physical implementation module generating physical implementation data for the integrated circuit from the HDL representation as synthesized.

10. The apparatus of claim 9, wherein the integrated circuit comprises a programmable logic device (PLD), and where the physical implementation data comprises configuration data for the PLD.

11. The apparatus of claim 9, wherein the intermediate representation and the transformed representation comprise extensible markup language (XML) documents, and wherein the program analyzer includes an extensible stylesheet language transformation (XSLT) processor for generating the hierarchy of elements.

12. The apparatus of claim 9, wherein the programming constructs, for each of the plurality of processes, define one or more of: (a) an interface having one or more ports; (b) persistent state variables; (c) a state machine; or (d) one or more actions, each of the one or more actions defined by procedural instruction data and firing rule data for triggering the procedural instruction data.

13. The apparatus of claim 9, wherein the programming constructs, for each of the plurality of communication channels, define a connection for propagating tokens from at least one first process of the plurality of processes to at least one second process of the plurality of processes.

14. The apparatus of claim 13, wherein the connection defining at least one of the plurality of communication channels is modeled using a first-in-first-out memory (FIFO).

15. The apparatus of claim 9, wherein each of the plurality of communication channels includes a data bus, a send control line, and an acknowledge control line.

16. A computer readable medium having stored thereon software that, when executed by a processor, cause the processor to implement a circuit design for an integrated circuit, the software comprising:

code for specifying a program using a concurrent programming language, the program including programming constructs that define a plurality of processes and a plurality of communication channels; code for parsing the program to generate an intermediate representation;

code for generating a hierarchy of elements of the circuit design according to input ports and output ports that classify the programming constructs defining the interconnection of the plurality of processes by the plurality of communication channels of the program to produce a transformed representation; wherein the transformed representation is produced using the intermediate representation;

code for generating a hardware description language (HDL) representation of the circuit design from the transformed representation by translating the hierarchy of elements to a hierarchy of HDL constructs that implements the plurality of processes and the plurality of communication channels in hardware code for synthesizing the HDL representation; and code for generating physical implementation data for the integrated circuit from the HDL representation as synthesized.

* * * * *